United States Patent
Yamane

(10) Patent No.: US 7,756,661 B2
(45) Date of Patent: Jul. 13, 2010

(54) METHOD AND APPARATUS FOR MEASURING DIMENSION OF PHOTO-MASK PATTERN

(75) Inventor: Takeshi Yamane, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 756 days.

(21) Appl. No.: 11/700,943

(22) Filed: Feb. 1, 2007

(65) Prior Publication Data

US 2007/0201044 A1      Aug. 30, 2007

(30) Foreign Application Priority Data

Feb. 3, 2006      (JP) .............................. 2006-026690

(51) Int. Cl.
*G01B 11/04*      (2006.01)
(52) U.S. Cl. ............................. 702/97; 702/94; 702/95; 702/150; 356/394; 356/625; 382/141; 382/144; 382/145; 382/147
(58) Field of Classification Search .................. 702/97, 702/94, 95, 150; 356/625, 394; 382/144, 382/145
See application file for complete search history.

(56) References Cited

U.S. PATENT DOCUMENTS

| 4,805,123 | A  | * | 2/1989 | Specht et al. | ................ 382/144 |
| 6,067,375 | A  | * | 5/2000 | Tsudaka | ...................... 382/144 |
| 7,146,035 | B2 | * | 12/2006 | Okada et al. | ................ 382/144 |

2004/0257568 A1      12/2004      Yamane

FOREIGN PATENT DOCUMENTS

JP            9-196624          7/1997

OTHER PUBLICATIONS

Allsop, John et al., "Photomask CD Metrology at the 100nm Node," *Photomask and Next-Generation Lithography Mask Technology IX*, Proceedings of SPIE, vol. 4754 (2002), pp. 745-757.
Yamane, et al., "Assurance of CD for 45 nm Half-Pitch with Immersion Microscope", Proc. of SPIE, vol. 6283, pp. 628314-1 to 628314-8, (2006).

* cited by examiner

*Primary Examiner*—Drew A Dunn
*Assistant Examiner*—Sujoy K Kundu
(74) *Attorney, Agent, or Firm*—Finnegan, Henderson, Farabow, Garrett & Dunner, L.L.P.

(57) ABSTRACT

A method for measuring a dimension of a pattern formed on a semiconductor light-exposure mask includes performing a preparation arranged to form a first relationship between measured values of dimensions of opaque patterns and misalignments of detected edge positions, and a second relationship between measured values of dimensions of clear patterns and misalignments of detected edge positions, performing detection/measurement arranged to detect opposite two edge positions of a measurement target pattern, and to measure a dimension of the measurement target pattern bounded by the two edge positions and dimensions of adjacent patterns respectively adjacent to the two edge positions, and performing correction arranged to respectively correct two detected edge positions of the measurement target pattern, with reference to one or both of the first and second relationships formed in the preparation, and measured values of the dimensions obtained in the detection/measurement.

17 Claims, 9 Drawing Sheets

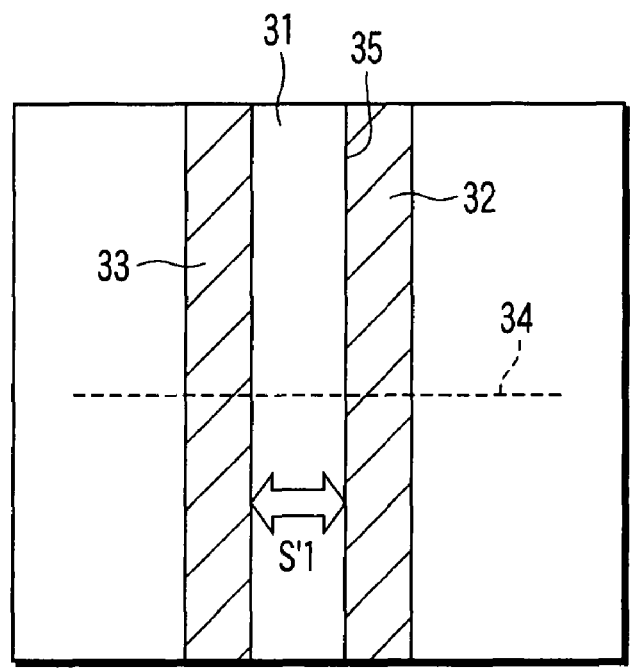
F I G. 2A
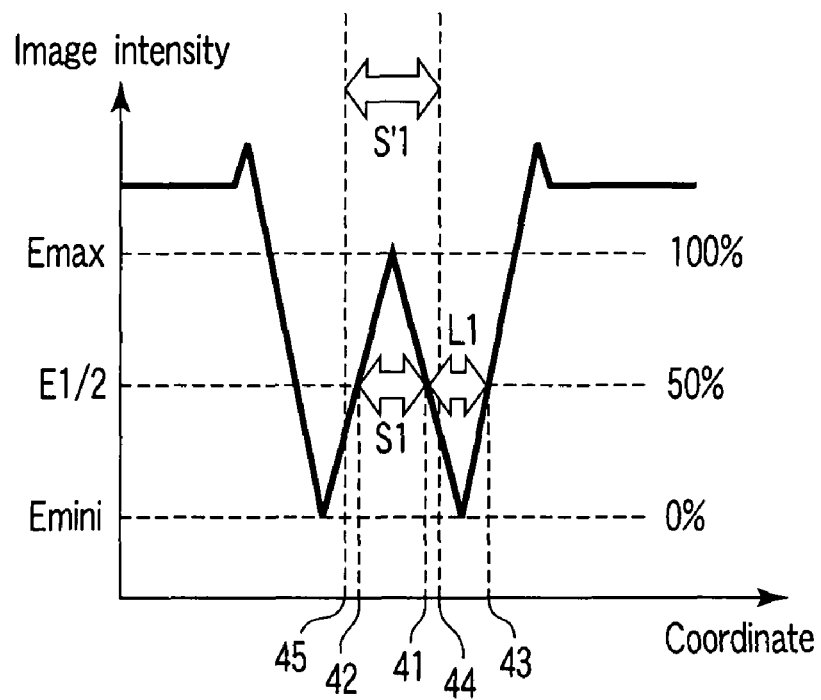
F I G. 2B

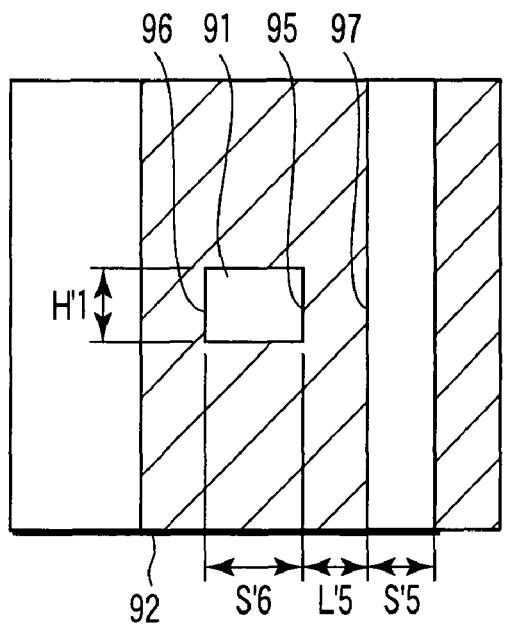
F I G. 9
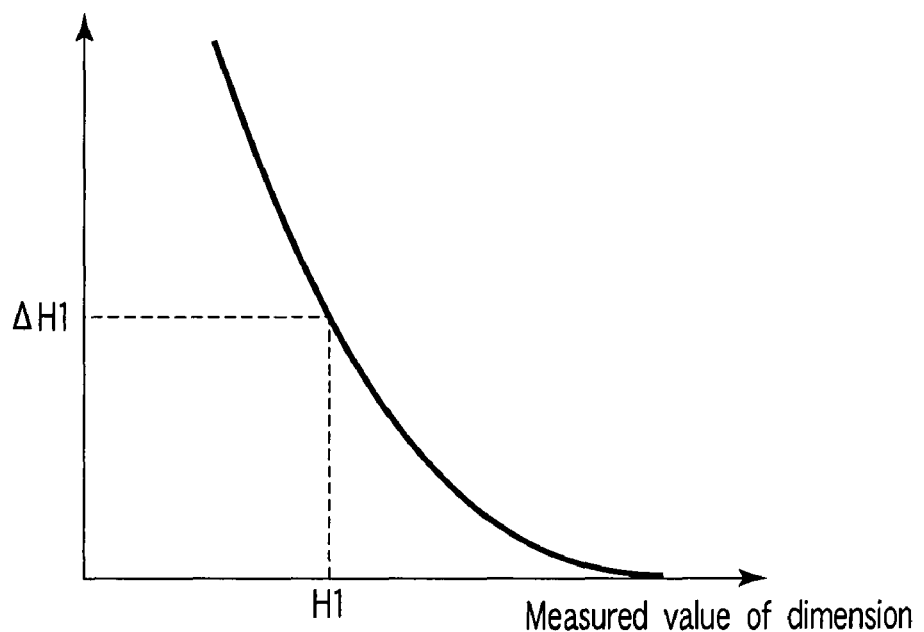
F I G. 10

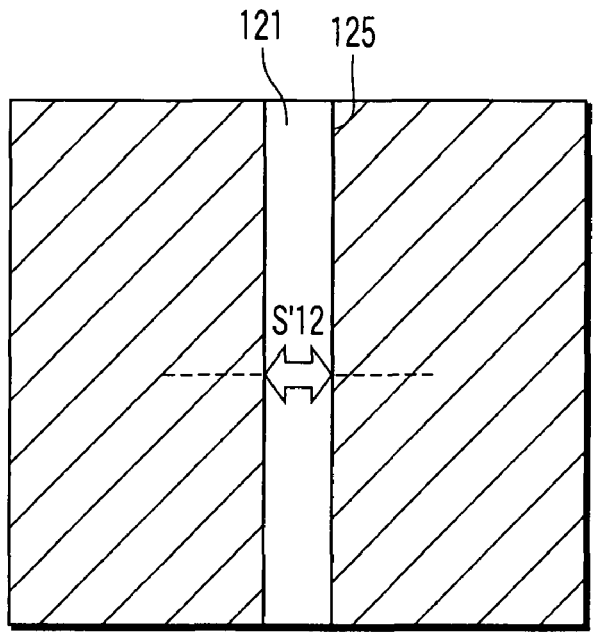
F I G. 12A
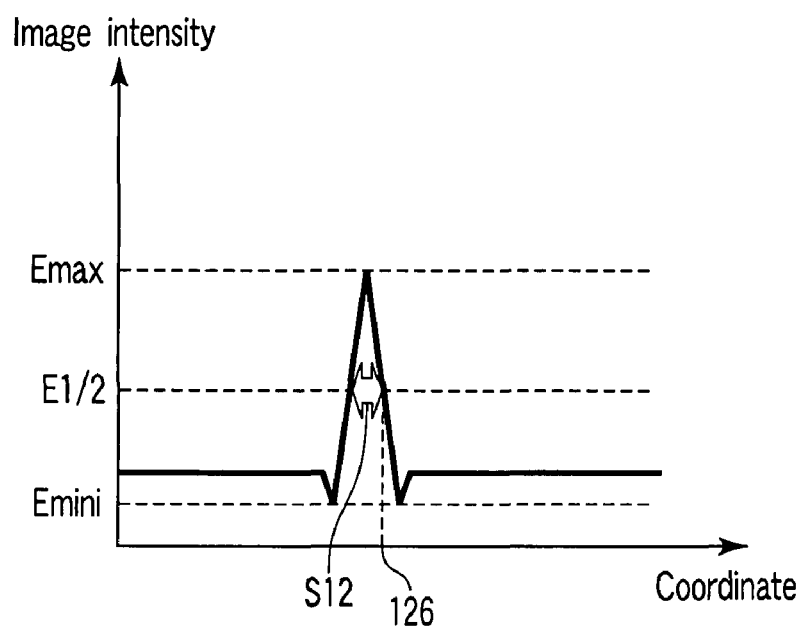
F I G. 12B

METHOD AND APPARATUS FOR MEASURING DIMENSION OF PHOTO-MASK PATTERN

CROSS-REFERENCE TO RELATED APPLICATIONS

This application is based upon and claims the benefit of priority from prior Japanese Patent Application No. 2006-026690, filed Feb. 3, 2006, the entire contents of which are incorporated herein by reference.

BACKGROUND OF THE INVENTION

1. Field of the Invention

The present invention relates to a method and apparatus for measuring a dimension of a pattern formed on a photo-mask.

2. Description of the Related Art

In general, an optical microscope is used as a device for measuring a dimension of a pattern formed on a photo-mask, because it can prevent the photo-mask from being damaged and it can provide good measurement repeatability when the same position is repeatedly measured. According to a conventional dimension measurement method using an optical microscope, an image of a pattern is first obtained by the optical microscope. Then, a certain relative value relative to the maximum value and minimum value of the image intensity profile (for example, the medium value between the two values) is set as a threshold, and the distance between positions reaching the threshold is output as a measured value of the dimension of this portion (for example, see Jpn. Pat. Appln. KOKAI Publication No. 9-196624 (Patent Document 1)).

However, where a pattern dimension is too small for an optical microscope to sufficiently resolve, the position coordinate identified by a threshold, determined in accordance with a relative value as described above, does not agree with a pattern edge. As a result, a measured value of a dimension disadvantageously greatly differs from the actual value of the dimension.

As a technique for solving this problem, there is proposed a method to be performed as follows (for example, see Photomask CD metrology at the 100 nm node", John Allsop, et. al., Proceeding of SPIE, Vol. 4754, pp. 745-757 (2002) (Non-Patent Document 1)). Specifically, dimensions of a plurality of patterns having different dimensions are measured by an optical microscope. Further, actual values of the dimensions are obtained by a scanning electron microscope having a resolving power higher than that of the optical microscope. The measured values of the dimensions obtained by the optical microscope and the actual values of the dimensions are plotted to form a curved line showing the relationship between them. Then, this curved line is used to convert a measured value of a dimension to an actual value of the dimension.

However, there is a case where a space pattern (clear pattern) is interposed between line patterns (opaque pattern), and at least one of the line patterns cannot be sufficiently resolved by a microscope. In this case, even where a curved line showing the relationship between measured values of dimensions and actual values of the dimensions is used to convert a measured value of a dimension, the value thus obtained by conversion does not necessarily agree with the actual value of the dimension.

As described above, conventionally, where a dimension of a pattern formed on a photo-mask is measured by an optical microscope, if the resolving power is not enough for the measurement target pattern or adjacent pattern, a value obtained from a measured value of a dimension does not necessarily agree with the actual value of the dimension. Accordingly, it is preferable to provide a pattern dimension measurement method and dimension measurement apparatus using a microscope, which allow a dimension of a photomask pattern to be measured with high accuracy, even if the resolving power is not enough for the measurement target pattern or adjacent pattern.

BRIEF SUMMARY OF THE INVENTION

According to a first aspect of the present invention, there is provided a method for measuring a dimension of a pattern formed on a semiconductor light-exposure mask, the method comprising: performing a preparation arranged to form a first relationship between measured values of dimensions of opaque patterns obtained by a microscope and misalignments of detected edge positions obtained by the microscope, and a second relationship between measured values of dimensions of clear patterns obtained by the microscope and misalignments of detected edge positions obtained by the microscope; performing detection/measurement arranged to detect opposite two edge positions of a measurement target pattern by the microscope, and to measure a dimension of the measurement target pattern bounded by the two edge positions and dimensions of adjacent patterns respectively adjacent to the two edge positions; performing correction arranged to respectively correct two detected edge positions of the measurement target pattern, with reference to one or both of the first and second relationships formed in the preparation, and measured values of the dimensions obtained in the detection/measurement; and outputting a distance between the detected edge positions corrected in the correction, as a determined value of the dimension of the measurement target pattern.

According to a second aspect of the present invention, there is provided an apparatus for measuring a dimension of a pattern formed on a semiconductor light-exposure mask, the apparatus comprising: a microscope configured to detect a measurement target pattern formed on the semiconductor light-exposure mask; a storage section that stores a first relationship between measured values of dimensions of opaque patterns obtained by the microscope and misalignments of detected edge positions obtained by the microscope, and a second relationship between measured values of dimensions of clear patterns obtained by the microscope and misalignments of detected edge positions obtained by the microscope; an edge detecting section configure to detect opposite two edge positions of the measurement target pattern, based on a detection signal obtained by the microscope; a dimension measuring section configured to measure a dimension of the measurement target pattern bounded by the two edge positions and dimensions of adjacent patterns respectively adjacent to the two edge positions, based on a detection signal obtained by the microscope; a correcting section configured to respectively correct two detected edge positions of the measurement target pattern, with reference to one or both of the first and second relationships stored in the storage section, and measured values of the dimensions obtained by the dimension measuring section; and an output section configured to output a distance between the detected edge positions corrected by the correcting section, as a determined value of the dimension of the measurement target pattern.

BRIEF DESCRIPTION OF THE SEVERAL VIEWS OF THE DRAWING

FIGS. 2A and 2B are views showing an example of patterns formed on a photo-mask and a detection signal, respectively, for explanation of the first embodiment;

FIG. 9 is a view showing an example of patterns including a laterally long rectangular pattern, for explanation of the second embodiment;

FIG. 10 is a view showing the relationship between measured values of dimensions of the shorter side of a rectangular pattern and misalignments of detected edge positions, for explanation of the second embodiment;

FIGS. 12A and 12B are views showing an example of patterns and a detection signal, respectively, for explanation of a dimension measurement method according to a conventional technique;

DETAILED DESCRIPTION OF THE INVENTION

In the process of developing the present invention, the inventor studied issues concerning the conventional technique for measuring a dimension of a pattern formed on a photo-mask. As a result, the inventor has arrived at the findings given below.

Figure 11A:
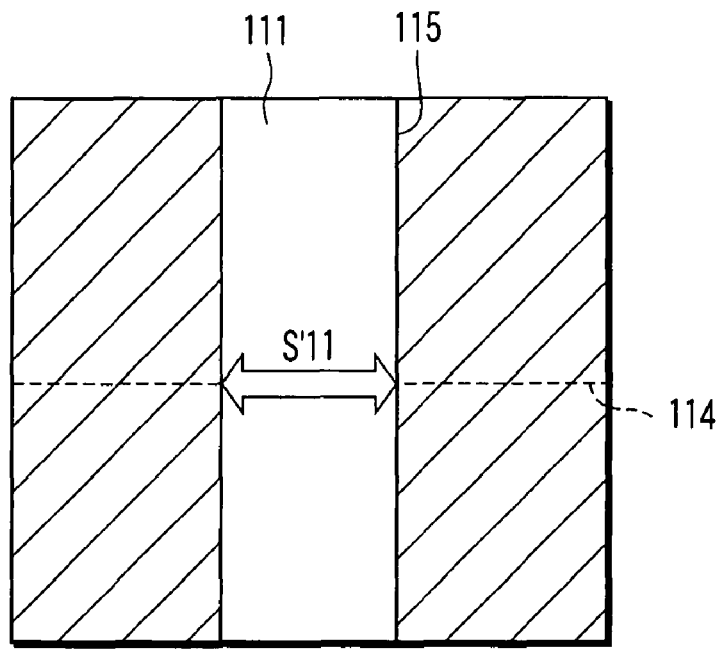
FIGS. 11A and 11B are views showing an example of patterns and a detection signal, respectively, for explanation of a dimension measurement method according to a conventional technique.
Figure 11B:
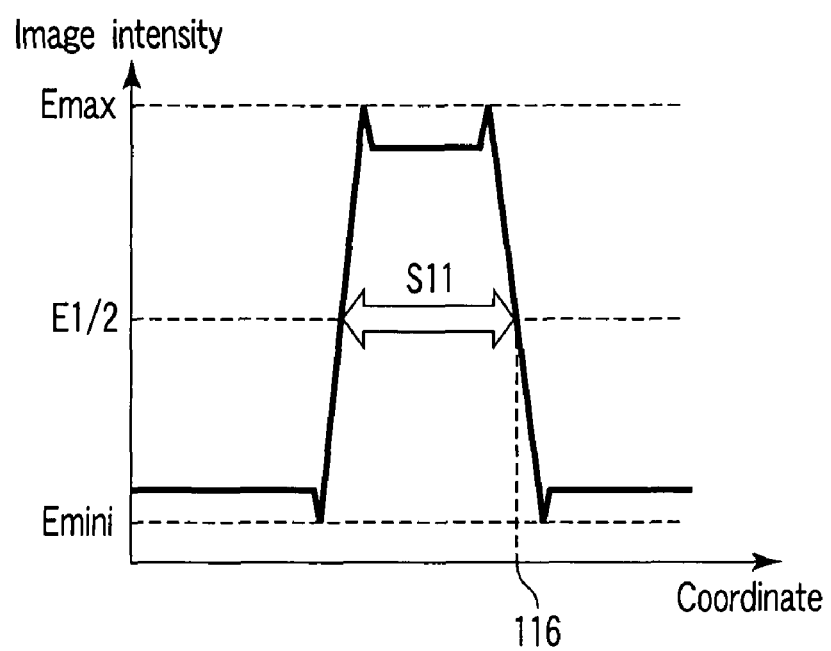

FIGS. 11A and 11B are views showing an example of a dimension measurement method using an optical microscope, according to Patent Document 1 described above. In this case, it is assumed that measurement is made on a dimension of a clear pattern (space pattern) 111 having no opaque film formed on a photo-mask.

An image of the space pattern 111 shown in FIG. 11A is picked up by an optical microscope, and the image intensity on a straight line 114 including a measurement position is plotted, so that an image intensity profile is formed, as shown in FIG. 11B. In this image intensity profile, the distance $S_{11}$ between positions reaching a certain threshold $E_{1/2}$ is output as a measured value of the dimension of this portion. In general, a certain relative value relative to the maximum value $E_{max}$ and minimum value $E_{mini}$ (for example, the medium value between the two values) is set as the threshold $E_{1/2}$, so that the threshold shows a position coordinate 116 corresponding to a pattern edge 115. As a result, it is possible to output a measured value $S_{11}$ of the dimension that agrees with an actual value $S'_{11}$ of the dimension.

However, as shown in FIG. 12A, where a dimension of a space pattern 121 is too small for an optical microscope to sufficiently resolve, the maximum value $E_{max}$ of the image intensity profile becomes lower, as shown in FIG. 12B, as compared to the case shown in FIG. 11B. In this case, the threshold $E_{1/2}$ determined by a relative value as described above shows a position coordinate 126 that does not agree with a pattern edge 125. As a result, a measured value $S_{12}$ of the dimension greatly differs from an actual value $S'_{12}$ of the dimension.

Figure 14:
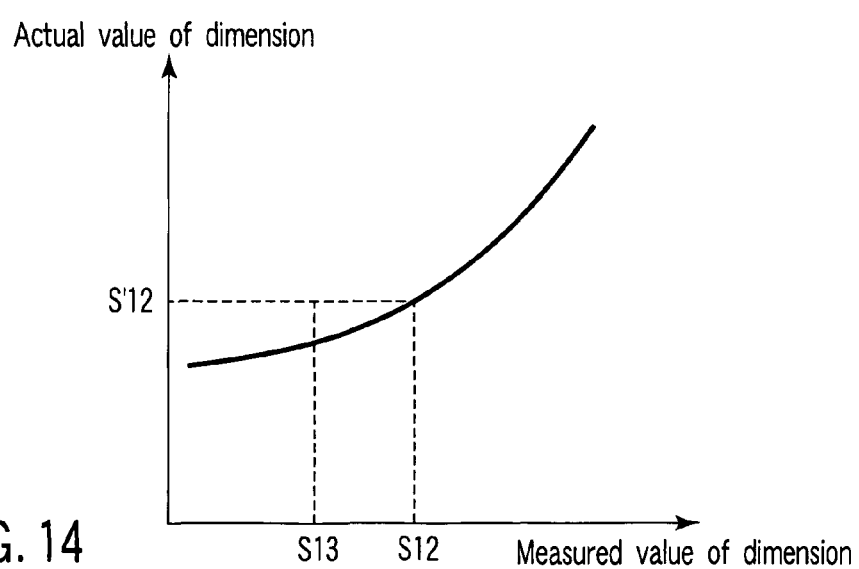
FIG. 14 is a view showing the relationship between measured values of dimensions of patterns and actual values of dimensions, for explanation of a conventional technique.

In order to solve this problem, Non-Patent Document 1 described above discloses the following method. Specifically, dimensions of a plurality of space patterns having different dimensions (see FIG. 3) are measured by an optical microscope. Further, actual values of the dimensions are obtained by a microscope (for example, a scanning electron microscope) having a resolving power higher than that of the optical microscope. The measured values of the dimensions obtained by the optical microscope and the actual values of the dimensions are plotted to form a curved line showing the relationship between them, as shown in FIG. 14. Then, this curved line is used to convert a measured value $S_{12}$ of a dimension to an actual value $S'_{12}$ of the dimension, thereby performing accurate dimension measurement.

Figure 13A:
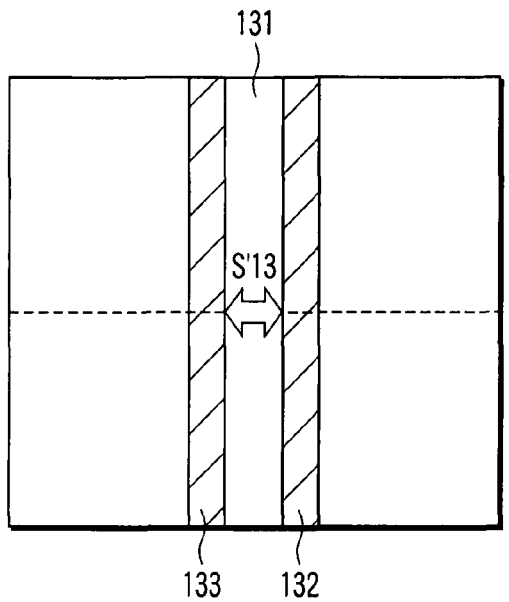
FIGS. 13A and 13B are views showing an example of patterns and a detection signal, respectively, for explanation of a dimension measurement method according to a conventional technique.
Figure 13B:

However, as shown in FIG. 13, where a dimension $S'_{13}$ of a space pattern 131 is equal to the dimension $S'_{12}$, and adjacent line patterns (patterns having opaque films) 132 and 133 on the right and left sides cannot be sufficiently resolved by an microscope, the minimum value $E_{mini}$ of the image intensity profile becomes higher, as shown in FIG. 13B, as compared to the case shown in FIG. 12B. In this case, the threshold $E_{1/2}$ determined by a relative value as described above shows a measured value $S_{13}$ of the dimension that does not agree with the dimension $S_{12}$, i.e., this is not present on the curved line described above, as shown in FIG. 14. In other words, other than a measurement target pattern, there is a case where at least one of the adjacent patterns cannot be sufficiently resolved by an optical microscope. In this case, even where a curved line showing the relationship between measured values of dimensions and actual values of the dimensions is used to convert a measured value of a dimension, the value thus obtained by conversion does not necessarily agree with the actual value of the dimension.

Embodiments of the present invention achieved on the basis of the findings given above will now be described with reference to the accompanying drawings. In the following description, the constituent elements having substantially the

First Embodiment

Figure 1:
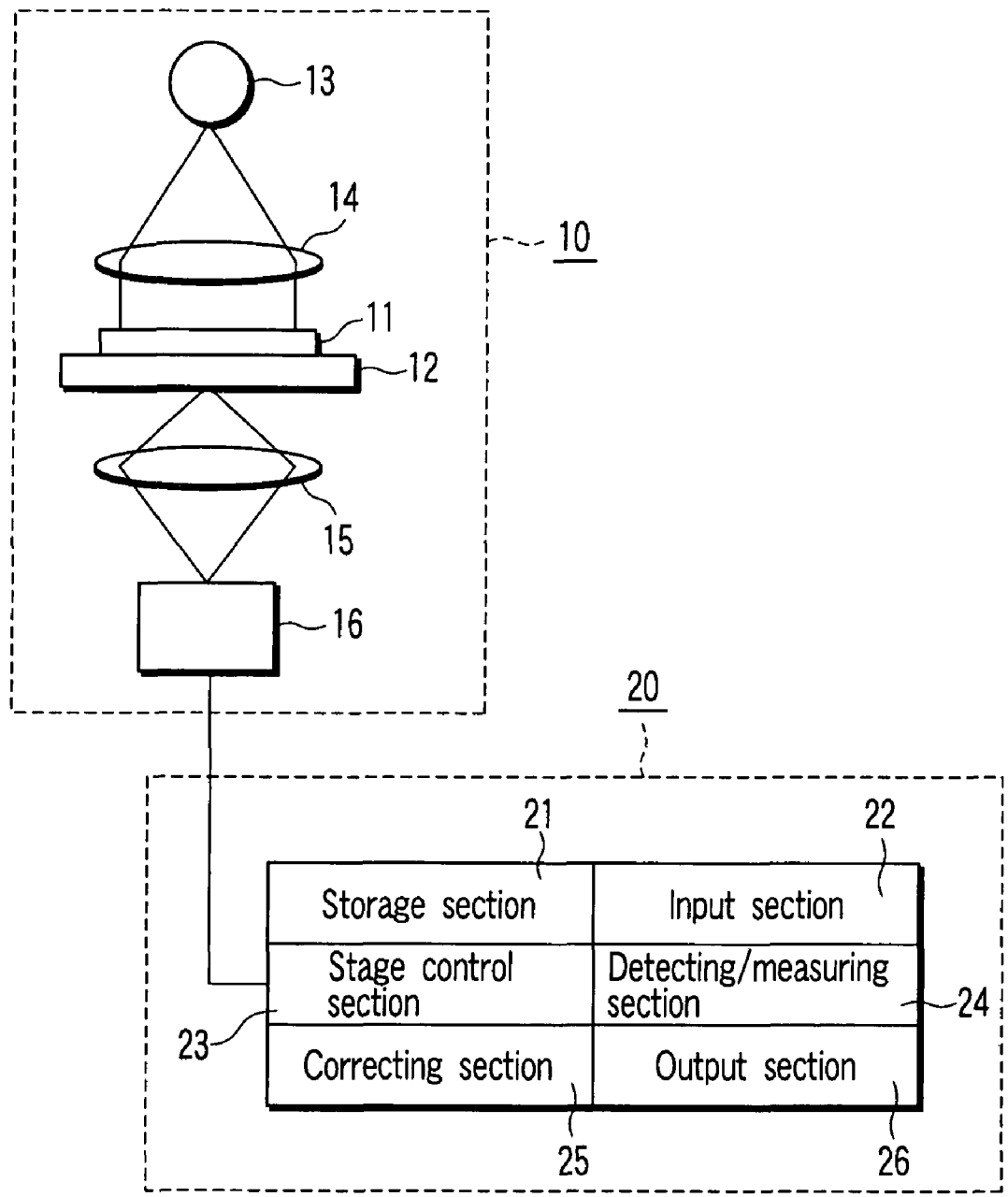
FIG. 1 is a view schematically showing a pattern dimension measurement apparatus according to a first embodiment of the present invention.

FIG. 1 is a view schematically showing a pattern dimension measurement apparatus according to a first embodiment of the present invention.

The pattern dimension measurement apparatus according to this embodiment comprises an optical microscope 10 for optically detecting photo-mask patterns, and a computer 20 for performing an arithmetical operation to obtain dimensions of photo-mask patterns based on detection signals output from the microscope 10.

The optical microscope 10 includes a stage 12, optical components, and a camera 16. The stage 12 is configured to support a photo-mask 11 thereon and move the photo-mask 11 among arbitrary positions. The optical components include members, such as a light source 13, a condenser lens 14, and an objective lens 15, necessary for forming an image of patterns on the photo-mask 11. The camera 16 is configured to pick up the formed image of patterns on the photo-mask 11.

The computer 20 includes a storage section 21, an input section 22, a stage control section 23, a detecting/measuring section 24, a correcting section 25, and an output section 26. The storage section 21 is configured to store data concerning relationships described later. The input section 22 is used to designate patterns to be measured (measurement target patterns). The stage control section 23 is configured to control movement of the stage 12. The detecting/measuring section 24 is configured to measure dimensions of patterns. The correcting section 25 is configured to correct detected positions. The output section 26 is used to output a determined value of a dimension.

For example, the storage section 21 is formed of a semiconductor memory, which stores the relationship between measured values of dimensions of space patterns and misalignments of detected edge positions, and the relationship between measured values of dimensions of line patterns and misalignments of detected edge positions. In the storage section 21, each of the relationships may be stored as a relationship formula or as a table. The input section 22 is formed of, e.g., a keyboard, through which the position coordinates of measurement target patterns on the photo-mask 11 are input by an operator. The stage control section 23 performs control to move the stage 12 to a determined position in accordance with an instruction input through the input section 22.

The detecting/measuring section 24 is configured to detect an edge position of a measurement target pattern and to measure dimensions of a space pattern and a line pattern in contact with the edge, based on detection signals output from the camera 16. More specifically, at first, an image intensity profile of a measurement position is formed from a detection signal output from the camera 16, and two edge positions of the measurement target pattern are detected by use of a predetermined threshold. Further, a dimension of a space pattern in contact with each edge and a dimension of a line pattern in contact with each edge are respectively measured.

The correcting section 25 is configured to correct these detected positions, based on the detected edge positions of the measurement target pattern, and the dimensions of the space pattern and line pattern in contact with each edge, with reference to relationship formulas stored in the storage section 21. More specifically, based on the dimension of the space pattern in contact with one of the edges of the measurement target pattern, and the dimension of the line pattern in contact with this edge, both of which are obtained by the detecting/measuring section 24, the detected position of this edge is corrected by use of relationship formulas stored in the storage section 21. Similarly, based on the dimension of the space pattern in contact with the other of the edges of the measurement target pattern, and the dimension of the line pattern in contact with this edge, the detected position of this edge is corrected by use of relationship formulas stored in the storage section 21. The distance between the two edge positions thus corrected is set as a determined value of the dimension of the measurement target pattern. The output section 26 is formed of an indicator, such as a display, in which the distance between the detected positions thus corrected is output as the determined value of the dimension.

Next, an explanation will be given of a pattern measurement method by use of the apparatus described above.

It is assumed that measurement is made on a dimension of a space pattern 31 formed on a photo-mask shown in FIG. 2A. In FIG. 2A, there is shown line patterns 32 and 33, a straight line 34 including the measurement position of a measurement target pattern, and an edge 35 of the measurement target pattern. For example, the photo-mask comprises a quartz substrate and a chromium film formed on the substrate, wherein part of the chromium film is removed in accordance with a necessary pattern. The space pattern corresponds to an area from which part of the chromium film is removed, while the line pattern corresponds to an area on which part of the chromium film is left.

Figure 3:
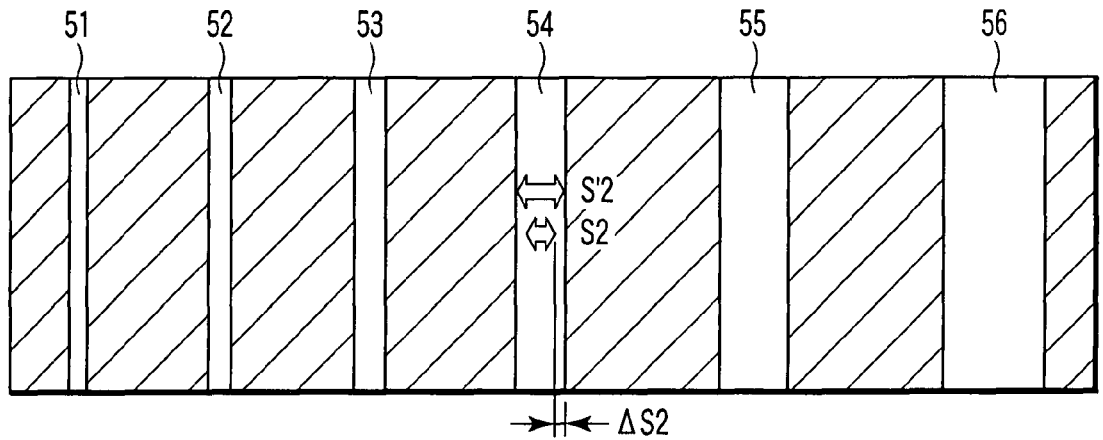
FIG. 3 is a view showing an example of space patterns having different dimensions.
Figure 4:
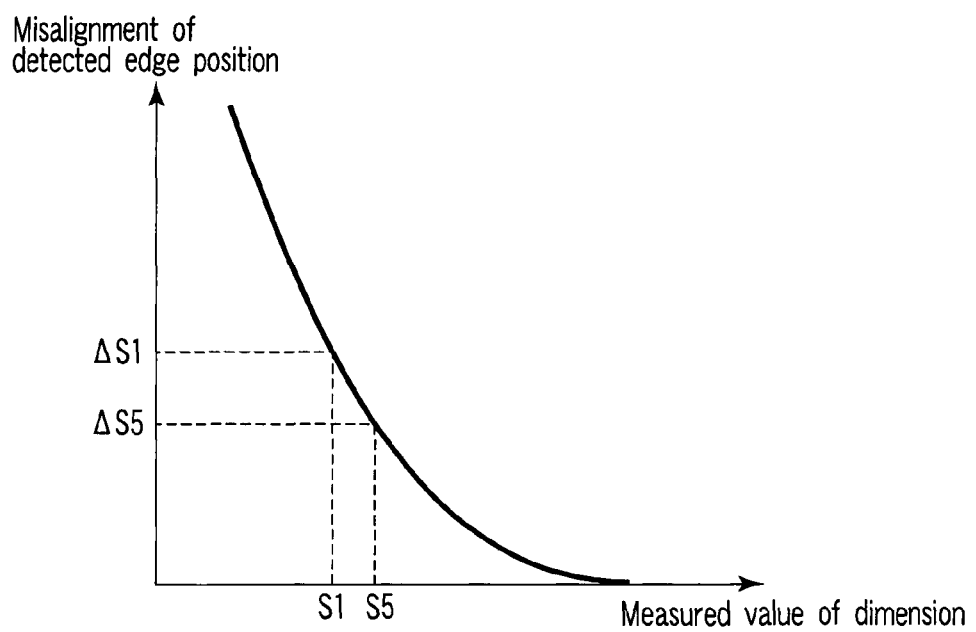
FIG. 4 is a view showing the relationship between measured values of dimensions of space patterns and misalignments of detected edge positions.

At first, as shown in FIG. 3, the dimensions of a plurality of space patterns 51 to 56 having different dimensions are measured by the optical microscope 10 and a microscope (for example, a scanning electron microscope) having a resolving power higher than that of the optical microscope 10. Where a measured value $S_2$ of a dimension is obtained by the optical microscope, and a measured value $S'_2$ of the dimension is obtained by the scanning electron microscope, $(S'_2-S_2)/2$ expresses a misalignment $\Delta S_2$ of the pattern edge position detected by the optical microscope 10. Then, measured values $S_2$ of dimensions and misalignments $\Delta S_2$ are plotted for all the patterns shown in FIG. 3, so that a curved line is formed, as shown in FIG. 4, as a preparation.

Then, the relationship between measured values $S_2$ of dimensions and misalignments $\Delta S_2$ for all the patterns is tabularized and stored in the storage section 21. Alternatively, a relationship formula representing the curved line may be formed and stored in the storage section 21.

Figure 5:
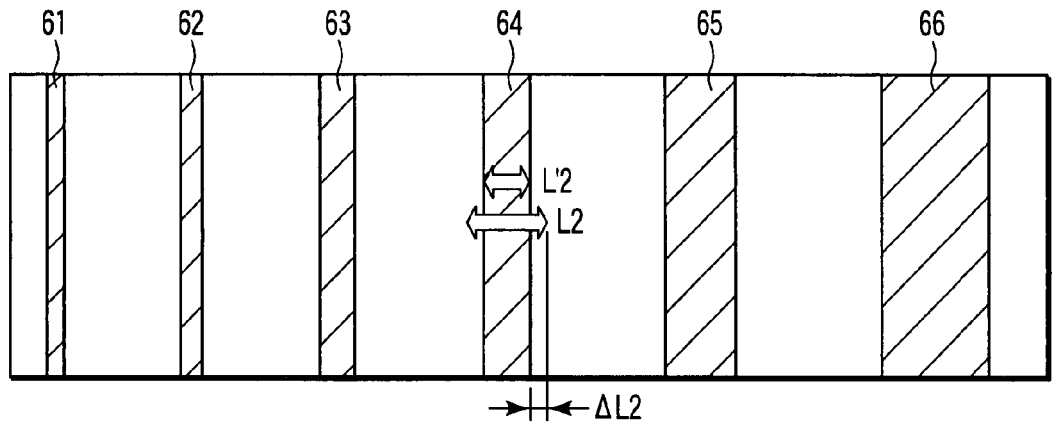
FIG. 5 is a view showing an example of line patterns having different dimensions.
Figure 6:
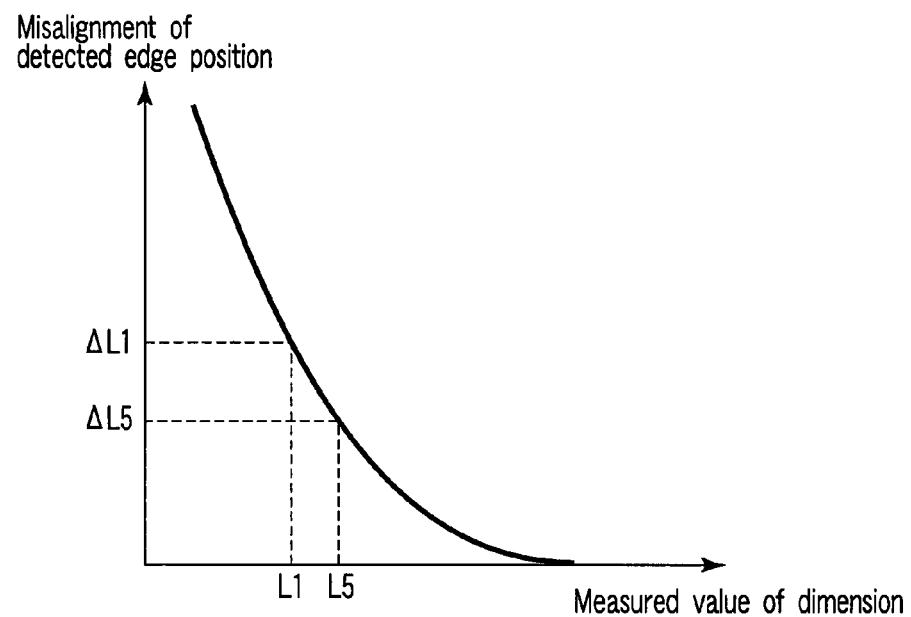
FIG. 6 is a view showing the relationship between measured values of dimensions of line patterns and misalignments of detected edge positions.

Similarly, as shown in FIG. 5, the dimensions of a plurality of line patterns 61 to 66 having different dimensions are measured by the optical microscope 10 and a microscope (for example, a scanning electron microscope) having a resolving power higher than that of the optical microscope 10. Where a measured value $L_2$ of a dimension is obtained by the optical microscope, and a measured value $L'_2$ of the dimension is obtained by the scanning electron microscope, $(L'_2-L_2)/2$ expresses a misalignment $\Delta L_2$ of the pattern edge position detected by the optical microscope 10. Then, measured values $L_2$ of dimensions and misalignments $\Delta L_2$ are plotted for all the patterns shown in FIG. 5, so that a curved line is formed, as shown in FIG. 6, as a preparation.

Then, the relationship between measured values $L_2$ of dimensions and misalignments $\Delta L_2$ for all the patterns is tabularized and stored in the storage section 21. Alternatively, a relationship formula representing the curved line may be formed and stored in the storage section 21.

Then, an image of the patterns on the photo-mask shown in FIG. 2A is picked up by the optical microscope 10. The image intensity profile on the straight line 34 including the measurement position is plotted, so that the image intensity profile is formed, as shown in FIG. 2B. Then, a detected position 41 corresponding to the edge 35 of the measurement target pattern is obtained by use of a threshold $E_{1/2}$ set at, e.g., the 50% position relative to the maximum value $E_{max}$ of 100% and the minimum value $E_{mini}$ of 0% in the image intensity profile. Further, detected positions 42 and 43 of edges of the patterns adjacent to the detected position 41 on both sides are obtained by use of the image intensity profile and threshold $E_{1/2}$. Then, a measured value $S_1$ of the dimension of the space pattern 31 is obtained from the distance between detected positions 41 and 42. Further, a measured value $L_1$ of the dimension of the line pattern 32 is obtained from the distance between the detected positions 41 and 43.

Then, a misalignment $\Delta S_1$ of the detected pattern edge position is derived from the measured value $S_1$ of the dimension thus obtained, with reference to the curved line shown in FIG. 4. Further, a misalignment $\Delta L_1$ of the detected pattern edge position is derived from the measured value $L_1$ of the dimension thus obtained, with reference to the curved line shown in FIG. 6. These misalignments are added up to make a correction amount $(\Delta S_1+\Delta L_1)$ of the detected pattern edge position 41. Then, the detected pattern edge position 41 is corrected by use of this correction amount $(\Delta S_1+\Delta L_1)$, thereby obtaining a corrected detection position 44. Similarly, the detected pattern edge position 42 is corrected by use of a correction amount thereof calculated in the same way as described above, thereby obtaining a corrected detection position 45.

At the end, the distance $S'_1$ between corrected detection positions 44 and 45 is output as a determined value of the dimension of the space pattern 31 from the output section 26.

As described above, according to this embodiment, the relationship between measured values of dimensions of patterns and misalignments of detected edge positions is prepared in advance for an optical microscope 10 in relation to two patterns bounded by an edge of a measurement target pattern. This relationship is obtained by use of data concerning such values detected by the optical microscope 10 and such values measured by a scanning electron microscope. Then, when a dimension of a measurement target pattern is measured by the optical microscope 10, detected edge positions thereof obtained by the optical microscope 10 are corrected, so the dimension of the measurement target pattern can be measured with high accuracy. Accordingly, even if the resolving power is not enough for a measurement target pattern or adjacent pattern, a dimension of a photo-mask pattern can be measured with high accuracy.

Incidentally, according to this embodiment, a misalignment of a detected edge position of a measurement target pattern is obtained by a sum $(\Delta S_1+\Delta L_1)$ of a misalignment $\Delta S_1$ due to a space pattern and a misalignment $\Delta L_1$ due to a line pattern. In general, however, space patterns are more influential on the misalignment than line patterns are, because space patterns have higher light intensity. Accordingly, where a dimension of a line pattern is measured, correction may be performed while a misalignment $\Delta L_1$ due to the line pattern is always ignored to set $\Delta L_1$ at 0. In other words, where a dimension of a line pattern is measured, correction may be performed by use only of a misalignment $\Delta S_1$ due to a space pattern.

Figure 7:
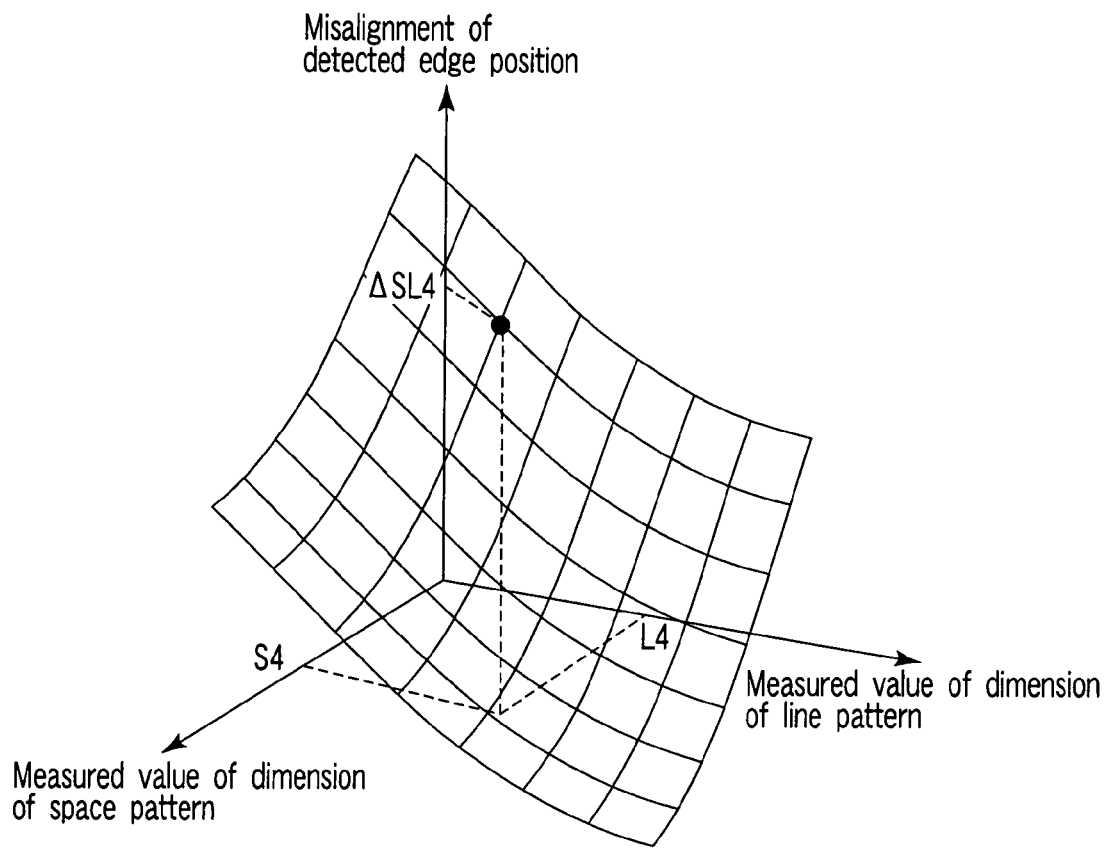
FIG. 7 is a view showing the relationship of misalignments of detected edge positions relative to measured values of dimensions of space patterns and measured values of dimensions of line patterns.

Further, as shown in FIG. 7, it may be arranged to form and use a three-dimensional curved line showing the relationship of misalignments of detected edge positions relative to measured values of dimensions of space patterns and measured values of dimensions of line patterns. In this case, the misalignment $\Delta SL_4$ of a detected pattern edge position relative to an actual pattern edge position can be directly obtained from a dimension of a space pattern $S_4$ and a dimension of a line pattern $L_4$.

This three-dimensional curved line may be tabularized and stored in the storage section 21. Alternatively, a relationship formula representing the three-dimensional curved line may be formed and stored in the storage section 21.

Second Embodiment

Figure 8:
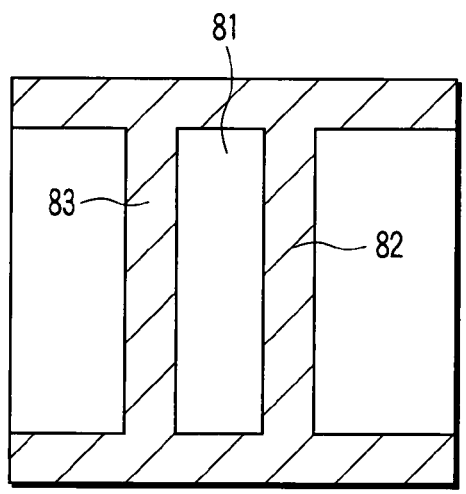
FIG. 8 is a view showing an example of patterns including a rectangular pattern, for explanation of a second embodiment of the present invention.

As shown in FIGS. 2A and 2B, the first embodiment is exemplified by a case directed to a plurality of straight line patterns, but the present invention is not limited to this embodiment. FIG. 8 is a view showing an example of patterns including a rectangular pattern, for explanation of a second embodiment of the present invention. FIG. 9 is a view showing an example of patterns including a laterally long rectangular pattern, for explanation of the second embodiment;

As shown in FIG. 8, where a rectangular space pattern 81 is measured, detected pattern edge positions can be corrected in the same way. Specifically, dimensions of the space pattern 81 and adjacent line patterns 82 and 83 are measured and used to correct detected edge positions of the space pattern 81.

Further, where a rectangular pattern shown in FIG. 9 is measured, detected pattern edge positions can be similarly corrected. In this case, as shown in FIG. 9, a space pattern 91 has a length shorter in the vertical direction than in the horizontal direction. For this laterally long rectangular pattern (clear pattern) 91, where a dimension $S'_6$ in the longer side direction is measured, the misalignment of a detected pattern edge position relative to an actual pattern edge position at the pattern edge 95 is more influenced by the shorter side than by the longer side.

Accordingly, even where the dimension in the longer side direction is measured, the following sequence may be performed. Specifically, a curved line showing the relationship between measured values $H_1$ of dimensions of the shorter side and misalignments $\Delta H_1$ of detected pattern edge positions is prepared, as shown in FIG. 10. Then, a misalignment $\Delta H_1$ is obtained from a measured value $H_1$ of the dimension of the shorter side, with reference to the curved line shown in FIG. 10. On the other hand, a dimension $L'_5$ shown in FIG. 9 is measured, and a misalignment $\Delta L_5$ is obtained from a measured value $L_5$ of the dimension, with reference to the curved line shown in FIG. 6. These misalignments are added up to make a correction amount $(\Delta H_1+\Delta L_5)$ of a detected position of the pattern edge 95. Then, the detected position of the pattern edge 95 is corrected by use of this correction amount $(\Delta H_1+\Delta L_5)$. Similarly, the detected position of the pattern edge 96 is corrected by use of a correction amount calculated in the same way described above. At the end, the distance between the corrected detection positions of the pattern edges 95 and 96 is output as a determined value of the dimension $S'_6$ shown in FIG. 9.

Further, the following sequence may be performed. Specifically, a measured value $L_5$ of the dimension $L'_5$ shown in FIG. 9 and a measured value $S'_5$ of the dimension $S_5$ shown in FIG. 9 are obtained. Then, these measured values are used to calculate a correction amount $(\Delta S_5+\Delta L_5)$ of a detected position of a pattern edge 97, with reference to the curved lines shown in FIGS. 4 and 6. Then, the detected position of the pattern edge 97 is corrected by use of this correction amount $(\Delta S_5+\Delta L_5)$. At the end, the distance between the corrected detection positions of the pattern edges 97 and 95 is output as a determined value of the dimension $L'_5$ shown in FIG. 9.

In addition to this, the following sequence may be performed. Specifically, a curved line showing the relationship between measured values $S_6$ of dimensions $S'_6$ of the longer side and misalignments $\Delta S_6$ of detected pattern edge positions is prepared. Then, a misalignment $\Delta S_6$ is obtained from a measured value $S_6$ of the dimension of the longer side, with reference to this curved line. Then, the misalignment $\Delta S_6$ is added to the misalignment $H_1$ described above. Consequently, dimension measurement can be performed with higher accuracy.

Matters Common to First and Second Embodiments

According to the two embodiments described above, a preparation is performed to obtain the relationship between measured values of dimensions of opaque patterns and misalignments of detected edge positions, and the relationship between measured values of dimensions of clear patterns and misalignments of detected edge positions. Then, a detected edge position of a measurement target pattern obtained by a microscope is corrected with reference to these relationships. Consequently, the dimension of the measurement target pattern can be measured with high accuracy. Accordingly, even if the resolving power is not enough for a measurement target pattern or adjacent pattern, a dimension of a photo-mask pattern can be measured with high accuracy.

The present invention is not limited to embodiments described above. In the embodiments, an optical microscope is used as the microscope of a pattern dimension measurement apparatus. However, the present invention may be similarly applied to a broad range of other microscopes, such as an atomic force microscope or scanning electron microscope. Where a scanning electron microscope is used, a beam acceleration voltage is set to be lower to prevent a mask from being damaged by beam scanning. Further, a mechanism for measuring an actual value of the dimension of a pattern is not necessarily limited to a scanning electron microscope. In this respect, any mechanism can be used, as long as it has measurement accuracy sufficiently higher than that of an optical microscope or the like used in a pattern dimension measurement apparatus.

In the embodiments, the measurement target is exemplified by a photo-mask. However, the present invention may be similarly applied to a broad range of other semiconductor light-exposure masks, such as an electron beam light-exposure mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for measuring a dimension of a pattern formed on a semiconductor light-exposure mask, the method comprising:

performing a preparation arranged to form a first relationship between measured values of dimensions of opaque patterns obtained by a microscope and misalignments of detected edge positions obtained by the microscope, and a second relationship between measured values of dimensions of clear patterns obtained by the microscope and misalignments of detected edge positions obtained by the microscope;

performing detection/measurement arranged to detect opposite two edge positions of a measurement target pattern by the microscope wherein the measurement target pattern includes a space pattern, and to measure a dimension of the measurement target pattern bounded by the two edge positions and dimensions of adjacent patterns respectively adjacent to the two edge positions wherein the adjacent patterns includes first and second line patterns;

performing correction arranged to respectively correct two detected edge positions of the measurement target pattern, with reference to one or both of the first and second relationships formed in the preparation, and measured values of the dimensions obtained in the detection/measurement;

wherein the performing correction comprises:

correcting detected first edge position of the space pattern, the first edge position corresponding to a boundary of the first line pattern and the space pattern, the correcting detected first edge position comprising obtaining a first misalignment at the first edge position by using measured value of dimension of first line pattern and the first relationship, obtaining a second misalignment at the first edge position by using measured value of dimension of the space pattern and the second relationship, and summing the first and second misalignments at the first edge position; and correcting detected second edge position of the space pattern, the second edge position corresponding to a boundary of the second line pattern and the space pattern, the correcting detected second edge position comprising obtaining a first misalignment at the second edge position by using measured value of dimension of the second line pattern and the first relationship, obtaining a second misalignment at the second edge position by using measured value of dimension of the space pattern and the second relationship, summing the first and second misalignments at the second edge position; and outputting a distance between the detected edge positions corrected in the correction, as a determined value of the dimension of the measurement target pattern.

2. The method according to claim 1, wherein the measurement target pattern is an opaque pattern and the adjacent patterns are clear patterns, and the correction is arranged to set a misalignment defined in the first relationship and due to the measurement target pattern itself to be zero.

3. The method according to claim 1, wherein the measurement target pattern is one of line patterns and space patterns alternately arrayed, and the two edge positions correspond to boundaries of the line patterns and space patterns.

4. The method according to claim 3, wherein the detection/measurement is arranged to measure dimensions of the measurement target pattern and the adjacent patterns respectively adjacent thereto on both sides, in a predetermined direction across the two edge positions.

5. The method according to claim 1, wherein at least one of the measurement target pattern and the adjacent patterns is a rectangular pattern having two longer sides and two shorter sides perpendicular to and shorter than the longer sides.

6. The method according to claim 5, wherein
the dimension of the measurement target pattern is a dimension in a direction parallel with the longer sides of the rectangular pattern,
the detection/measurement is arranged to measure a dimension of the shorter sides of the rectangular pattern, and
the correction is arranged to correct the two detected edge positions, by use of a measured value of the dimension of the shorter sides.

7. The method according to claim 5, wherein
the dimension of the measurement target pattern is a dimension in a direction parallel with the longer sides of the rectangular pattern,
the detection/measurement is arranged to measure a dimension of the longer sides of the rectangular pattern, and
the correction is arranged to correct the two detected edge positions, by use of a measured value of the dimension of the longer sides.

8. The method according to claim 1, wherein an optical microscope is used as the microscope.

9. The method according to claim 1, wherein the preparation is arranged to form the first relationship by measuring as the opaque patterns a plurality of line patterns having different dimensions by use of the microscope and a microscope having a higher resolving power than the microscope, and to form the second relationship by measuring as the clear patterns a plurality of space patterns having different dimensions by use of the two microscopes.

10. An apparatus for measuring a dimension of a pattern formed on a semiconductor light-exposure mask, the apparatus comprising:
a microscope configured to detect a measurement target pattern formed on the semiconductor light-exposure mask wherein the measurement target pattern includes a space pattern;
a storage section that stores a first relationship between measured values of dimensions of opaque patterns obtained by the microscope and misalignments of detected edge positions obtained by the microscope, and a second relationship between measured values of dimensions of clear patterns obtained by the microscope and misalignments of detected edge positions obtained by the microscope;
an edge detecting section configured to detect opposite two edge positions of the measurement target pattern, based on a detection signal obtained by the microscope;
a dimension measuring section configured to measure a dimension of the measurement target pattern bounded by the two edge positions and dimensions of adjacent patterns respectively adjacent to the two edge positions wherein the adjacent patterns include first and second line patterns, based on a detection signal obtained by the microscope;
a correcting section configured to respectively correct two detected edge positions of the measurement target pattern, with reference to one or both of the first and second relationships stored in the storage section, and measured values of the dimensions obtained by the dimension measuring section;
wherein the correcting section is configured to perform correcting detected first edge position of the space pattern, the first edge position corresponding to a boundary of the first line pattern and the space pattern, the correcting detected first edge position comprising obtaining a first misalignment at the first edge position by using measured value of dimension of first line pattern and the first relationship, obtaining a second misalignment at the first edge position by using measured value of dimension of the space pattern and the second relationship, and summing the first and second misalignments at the first edge position; and
correcting detected second edge position of the space pattern, the second edge position corresponding to a boundary of the second line pattern and the space pattern, the correcting detected second edge position comprising obtaining a first misalignment at the second edge position by using measured value of dimension of the second line pattern and the first relationship, obtaining a second misalignment at the second edge position by using measured value of dimension of the space pattern and the second relationship, summing the first and second misalignments at the second edge position; and
an output section configured to output a distance between the detected edge positions corrected by the correcting section, as a determined value of the dimension of the measurement target pattern.

11. The apparatus according to claim 10, wherein
the measurement target pattern is an opaque pattern and the adjacent patterns are clear patterns, and
the correction section is configured to set a misalignment defined in the first relationship and due to the measurement target pattern itself to be zero.

12. The apparatus according to claim 10, wherein the microscope is set to detect, as the measurement target pattern, one of line patterns and space patterns alternately arrayed, and the two edge positions correspond to boundaries of the line patterns and space patterns.

13. The apparatus according to claim 12, wherein the dimension measuring section is configured to measure dimensions of the measurement target pattern and the adjacent patterns respectively adjacent thereto on both sides, in a predetermined direction across the two edge positions.

14. The apparatus according to claim 10, wherein the microscope is set to detect, as at least one of the measurement target pattern and the adjacent patterns, a rectangular pattern having two longer sides and two shorter sides perpendicular to and shorter than the longer sides.

15. The apparatus according to claim 14, wherein
the dimension of the measurement target pattern is a dimension in a direction parallel with the longer sides of the rectangular pattern,
the dimension measuring section is configured to measure a dimension of the shorter sides of the rectangular pattern, and
the correction section is configured to correct the two detected edge positions, by use of a measured value of the dimension of the shorter sides.

16. The apparatus according to claim 14, wherein
the dimension of the measurement target pattern is a dimension in a direction parallel with the longer sides of the rectangular pattern,
the dimension measuring section is configured to measure a dimension of the longer sides of the rectangular pattern, and
the correction section is configured to correct the two detected edge positions, by use of a measured value of the dimension of the longer sides.

17. The apparatus according to claim 10, wherein the microscope comprises an optical microscope.

* * * * *

UNITED STATES PATENT AND TRADEMARK OFFICE
CERTIFICATE OF CORRECTION

| | | |
|---|---|---|
| PATENT NO. | : 7,756,661 B2 | Page 1 of 1 |
| APPLICATION NO. | : 11/700943 | |
| DATED | : July 13, 2010 | |
| INVENTOR(S) | : Yamane | |

It is certified that error appears in the above-identified patent and that said Letters Patent is hereby corrected as shown below:

Title page, Item (54), in the Title, line 1, change "PHOTO-MASK" to --PHOTOMASK--.

Column 1, line 2, change "PHOTO-MASK" to --PHOTOMASK--.

Claim 1, column 10, line 11, change "patterns includes" to --patterns include--.

Signed and Sealed this

Fourteenth Day of September, 2010

David J. Kappos
*Director of the United States Patent and Trademark Office*